(12) United States Patent
Lee et al.

(10) Patent No.: US 7,981,317 B2
(45) Date of Patent: Jul. 19, 2011

(54) COMPOSITION FOR SURFACE MODIFICATION OF A HEAT SINK AND METHOD FOR SURFACE TREATMENT OF THE HEAT SINK FOR PRINTED CIRCUIT BOARDS USING THE SAME

(75) Inventors: Young-Ho Lee, Busan (KR); Steve Chun, Incheon (KR); Dek-Gin Yang, Chungcheongbuk-do (KR); Chan-Yeup Chung, Daegu (KR); Yun-Seok Hwang, Busan (KR); Keun-Ho Kim, Daejeon (KR)

(73) Assignees: Samsung Electro-Mechanics Co., Ltd., Gyunggi-Do (KR); YMT Co., Ltd., Inchon (KR)

( * ) Notice: Subject to any disclaimer, the term of this patent is extended or adjusted under 35 U.S.C. 154(b) by 536 days.

(21) Appl. No.: 12/235,034

(22) Filed: Sep. 22, 2008

(65) Prior Publication Data

US 2009/0230085 A1 Sep. 17, 2009

(30) Foreign Application Priority Data

Mar. 14, 2008 (KR) .................. 10-2008-0024052

(51) Int. Cl.
*C09K 13/00* (2006.01)
(52) U.S. Cl. ............ 252/79.1; 252/79.2; 252/79.3; 252/79.4; 252/79.5

(58) Field of Classification Search .............. None
See application file for complete search history.

(56) References Cited

U.S. PATENT DOCUMENTS 7,176,269 B2 *  2/2007  Hakuta et al. ............ 528/34
2007/0134503 A1 *  6/2007  Espinosa ............ 428/450

FOREIGN PATENT DOCUMENTS

CN       1918248 A       2/2007
KR    10-2007-0010001    1/2007

OTHER PUBLICATIONS

Korean Office Action, with partial English translation, issued in Korean Patent Application No. KR 10-2008-0024052, dated Dec. 21, 2009.
Chinese Office Action, with English Translation, issued in Chinese Patent Application No. 200810170245.3, mailed May 12, 2010.

* cited by examiner

*Primary Examiner* — Duy-Vu N Deo
(74) *Attorney, Agent, or Firm* — McDermott Will & Emery LLP

(57) ABSTRACT

The present invention provides a composition for surface modification of a heat sink, the composition including: 0.01 to 10 parts by weight of an organic titanium compound; 0.01 to 5 parts by weight of an organic silane compound; 0.1 to 10 parts by weight of an organic acid; 0.01 to 5 parts by weight of a sequestering agent; and 0.1 to 10 parts by weight of a buffer with respect to 100 parts by weight of distilled water. The composition of the present invention provides excellent adhesion strength with prepreg, and improve heat releasing performance.

8 Claims, 4 Drawing Sheets

COMPOSITION FOR SURFACE MODIFICATION OF A HEAT SINK AND METHOD FOR SURFACE TREATMENT OF THE HEAT SINK FOR PRINTED CIRCUIT BOARDS USING THE SAME

CROSS-REFERENCE TO RELATED APPLICATION(S)

This application claims the benefit of Korean Patent Application No. 10-2008-0024052, entitled "Composition for surface modification of heat sink and method for surface treatment of heat sink using the same", filed on Mar. 14, 2008, with the Korea Intellectual Property Office, the contents of which are incorporated here by reference in its entirety.

BACKGROUND

1. Technical Field

The present invention relates to a composition for surface modification of a heat sink and method for surface treatment of the heat sink for printed circuit boards using the same, more particularly, to a composition for surface modification of a heat sink and method for surface treatment of the heat sink using the same, whereby the composition allows a printed circuit board itself to release heat and guarantees an excellent adhesive strength.

2. Description of the Related Art

Printed circuit board (PCB) is used to mechanically support and electrically connect electronic components using circuit pathways onto a substrate. The printed circuit board is an essential electronic component, which can be a nervous system if semiconductor is the brain in the electronic components.

As consumer products such as home appliances, mobile products, semiconductor equipments and industrial machineries grows rapidly, the demand of the printed circuit board is increasing. And further, with the development of electronic devices with smaller sizes and more advanced performances, the demands of printed circuit board products with smaller sizes, lighter weights and greater worth are increasing.

A demand in the production of certain printed circuit board products has been increasing steadily in spite of daunting in the printed circuit board market. Such products may be build-up multilayer boards, rigid-flexible boards, semiconductor package boards, and environment-friendly printed circuit boards, etc., which require high technologies and thus, cannot be manufactured in Asian countries including China due to materials, designing and production facilities. These technologies are applied to digital electronics products such as cell phones, digital cameras, DVDs, liquid crystal displays, digital video cameras, notebooks and the like.

An outstanding problem in above-mentioned digital electronics products is the heat generation in the printed circuit board due to increased power consumption resulted from multi-functionalities. Accordingly, efficient heat release is becoming an issue for preventing malfunctions and several methods for lowering temperature in the printed circuit board have been introduced. In particular, a method of installing a metal heat sink having high conductivity such as aluminum or copper to release high levels of heat generated while being operated.

In order to transfer heat effectively in the related art, a flexible sheet or grease is installed between a heat-generating electronic part and a heat-dissipating part. Thus, the path of heat flow from the heat-generating electronic part to the heat-dissipating part such as a heat sink is realized through the flexible sheet or grease.

The above-mentioned sheet or grease is very effective when the heat-dissipating part is fixed and pressed to or around the heat-generating electronic part. However, the heat transfer may not realized as desired when there is a wide gap between the heat-generating electronic part and the heat-dissipating part.

Therefore, the present invention provides a composition for surface modification of a heat sink and method for surface treatment of the heat sink of printed circuit boards using the same, without using a sheet or a grease of the related art, wherein the composition allows an excellent adhesive strength between the heat sink and prepreg, release heat generated in the printed circuit board easily, and removes a risk of voids being created between the heat-generating electronic part and the heat-dissipating part.

SUMMARY

On behalf of settle the above-mentioned problems, one aspect of the present invention provides a composition for surface modification of a heat sink, the composition including:

0.01 to 10 parts by weight of an organic titanium compound;
0.01 to 5 parts by weight of an organic silane compound;
0.1 to 10 parts by weight of an organic acid;
0.01 to 5 parts by weight of a sequestering agent; and
0.1 to 10 parts by weight of a buffer with respect to 100 parts by weight of distilled water.

According to one embodiment of the invention, the organic titanium compound may be at least one selected from the group consisting of diethanolamine titanate, acetylacetonate titanate, ethylacetoacetate titanate, triethanolamine titanate, lactic acid titanate and ammonium salt.

According to one embodiment of the invention, the organic silane compound may be at least one selected from the group consisting of ethyltrimethoxysilane, glycidoxypropyltrimethoxysilane, glycidoxypropylmethyldiethoxysilane, glycidoxypropyltriethoxysilane, aminopropyltrimethoxysilane, aminopropyltriethoxy silane and their derivatives.

According to one embodiment of the invention, the organic acid may be at least one selected from the group consisting of acetic acid, formic acid, succinic acid, malic acid, propionic acid and adipic acid.

According to one embodiment of the invention, the sequestering agent may be at least one selected from the group consisting of nitrilioacetic acid, ethylenediamine tetraacetic acid and triethanolamine.

According to one embodiment of the invention, the buffer may be at least one selected from the group consisting of monobasic acid, dibasic acid and their salts. For example, the buffer may be at least one selected from the group consisting of acetic acid, propionic acid, adipic acid, succinic acid, amino acetic acid, formic acid and their salts.

Another aspect of the invention provides a method for surface treatment of the heat sink of printed circuit boards, the method including:

preparing a heat sink;
etching at least one surface of the heat sink; and
surface-modifying said heat sink using the composition of the present invention.

When the surface of the heat sink is modified with the composition of the present invention, it may provide excellent adhesion strength with prepreg, and eases the dissipating of heat generated.

Additional aspects and advantages of the present invention will become apparent and more readily appreciated from the following description, including the appended drawings and claims, or may be learned by practice of the invention.

DETAILED DESCRIPTION

Figure 1A:
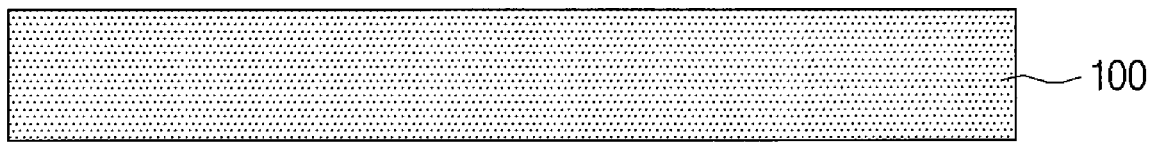
FIG. 1a to FIG. 1d are schematic diagrams illustrating a process of the surface modification according to one embodiment of the present invention.

According to one embodiment of the invention, there is provided a composition for surface modification of a heat sink, the composition including 0.01 to 10 parts by weight of an organic titanium compound; 0.01 to 5 parts by weight of an organic silane compound; 0.1 to 10 parts by weight of an organic acid; 0.01 to 5 parts by weight of a sequestering agent; and 0.1 to 10 parts by weight of a buffer with respect to 100 parts by weight of distilled water.

The composition for surface modification of a heat sink is subject to make the surface of the heat sink be rough through the hydrolysis, so that the adhesion strength between the heat sink and prepreg can be increased.

In the presence of the organic acid, the organic titanium compound is oxidized to form a titanium oxide and the organic silane further facilitates the above oxidation process, so that a titanium oxide layer (a rough surface layer) which increases the adhesion strength may be formed.

The components of the present composition will be described below in more detail.

The organic titanium compound used in the composition of the present invention is to enhance the adhesion strength by being oxidized to the titanium oxide in the presence of an organic acid.

Specific examples of the organic titanium compound include diethanolamine titanate, acetylacetonate titanate, ethylacetoacetate titanate, triethanolamine titanate, lactic acid titanate, and ammonium salt, etc., and the organic titanium compound may be used alone, or as a mixture of two or more. Preferably, triethanolamine titanate may be used.

The organic titanium compound may be contained in the range of 0.01 to 10 parts by weight, more preferably 0.1 to 5 parts by weight, with respect to 100 parts by weight of distilled water. If the content of the organic titanium compound is less than 0.01 parts by weight, a desired rough surface on heat sink may not be formed. If the content of the organic titanium compound exceeds 10 parts by weight, it may cause the precipitation of the metal compound.

The organic silane compound used in the composition of the present invention may facilitate the oxidation of the organic titanium compound to increase adhesion.

Specific examples of the organic silane compound include ethyltrimethoxysilane, glycidoxypropyltrimethoxysilane, glycidoxypropylmethyldiethoxysilane, glycidoxypropyltriethoxysilane, aminopropyltrimethoxysilane, aminopropyltriethoxy silane and their derivatives, etc. and the organic silane compound may be used alone or as a mixture of two or more.

The organic silane compound may be contained in the range of 0.01 to 5 parts by weight, more preferably 0.1 to 1 parts by weight, with respect to 100 parts by weight of distilled water. If the content of the organic silane compound is less than 0.01 parts by weight, it may not increase the adhesion strength with prepreg enough. If the content of the organic silane compound exceeds 5 parts by weight, it may interrupt the oxidation of the organic titanium compound.

The organic acid used in the composition of the present invention serves to oxidize the organic titanium into the corresponding titanium oxide.

Specific examples of the organic acid may include acids containing a carboxylic acid, for example, acetic acid, formic acid, succinic acid, malic acid, propionic acid and adipic acid, etc. and the organic acid may be used alone or as a mixture of two or more.

The organic acid may be contained in the range of 0.1 to 10 parts by weight, more preferably 1.0 to 5 parts by weight, with respect to 100 parts by weight of distilled water. If the content of the organic acid is less than 0.1 parts by weight, it may be hard to maintain pH. If the content of the organic acid exceeds 10 parts by weight, it may deteriorate the adhesion strength.

The sequestering agent used in the composition of the present invention may sequester the dissolved ions generated during the formation of the titanium oxide, maintain the solution clear, and form uniform titanium oxides by preventing damages by the ions to the surface treatment.

Specific examples of the sequestering agent may include nitrilioacetic acid, ethylenediamine tetraacetic acid and triethanolamine, etc. and the sequestering agent may be used alone, or as a mixture of two or more.

The sequestering agent may be contained in the range of 0.01 to 5 parts by weight, more preferably 0.1 to 1 parts by weight, with respect to 100 parts by weight of distilled water. If the content of the sequestering agent is less than 0.01 parts by weight, it is hard to complex the dissolved metal ions. If the content of the sequestering agent exceeds 5 parts by weight, it may deteriorate both the etching efficiency of the heat sink and the formation of rough surface.

The buffer used in the composition of the present invention may maintain pH to be constant against foreign acids and alkalis to be mixed.

Specific examples of the buffer may include at least one chosen from monobasic acids, dibasic acids and their salts. Propionic acid, adipic acid, succinic acid, amino acetic acid, formic acid and their salts may be used alone, or as a mixture of two or more.

The buffer may be contained in the range of 0.1 to 10 parts by weight, more preferably 0.5 to 5 parts by weight, with respect to 100 parts by weight of distilled water. If the content of the buffer is less than 0.1 parts by weight, it is hard to maintain pH to be constant. If the content of the buffer exceeds 10 parts by weight, it may not provide its effect as a buffer.

The composition of present invention may further include an organic solvent for increasing solubilities of the organic titanium compound and the organic silane compound.

Specific examples of the organic solvent may include isopropyl alcohol, heptane, etc and the organice solvent may be used alone or as a mixture of two or more. According to one embodiment, isopropyl alcohol may be used.

The organic solvent may be contained in the range of 0.1 to 10 parts by weight with respect to 100 parts by weight of distilled water.

Hereinafter, the method for surface treatment of the heat sink of printed circuit boards according to another aspect of the present invention will be described in detail with reference to FIG. 1a to FIG. 1d.

Figure 1B:
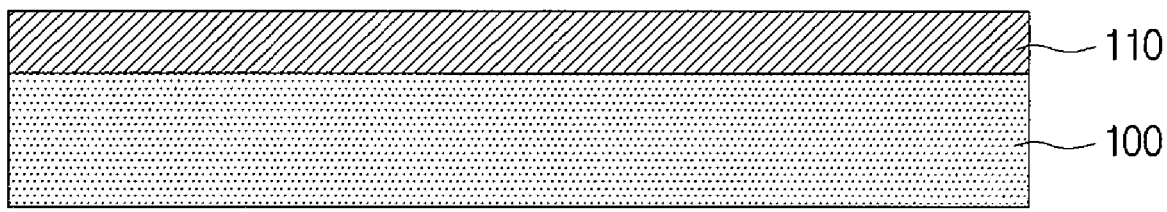
Figure 1C:
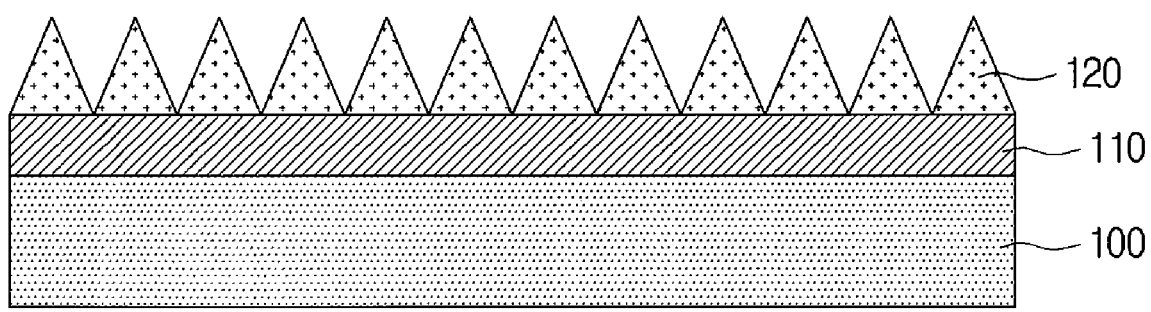

According to another embodiment of the invention, the method for surface treatment of the heat sink of printed circuit boards may include preparing a heat sink 100 (FIG. 1a);

etching at least one surface of the heat sink 100 (FIG. 1b); and modifying the surface of the heat sink 100 using the composition of the present invention (FIG. 1c).

The heat sink 100 used in the present invention may be a metal such as aluminum(Al), aluminum(Al) 1100, aluminum (Al) 1050, and aluminum(Al) 1235 and Al 1235 may be used according to one embodiment.

In the step of preparing a heat sink 100 (FIG. 1a), the surface of heat sink 100 may be degreased, so that oil on the at least one surface of the heat sink 100 is removed to facilitate the etching.

The heat sink 100 may be degreased using a metal degreaser containing sodium hydroxide such as EAC-703 available from Y. M. Technology, Co., Ltd., Korea, at a temperature of 50-60° C. for 5-10 minutes. After degreasing the heat sink 100, it may be washed with water for etching.

The etching of the surface of the heat sink 100 in the present invention (FIG. 1b) may be conducted with an etchant containing an acid such as EAS-704 available from Y. M. Technology, Co., Ltd., Korea, at a temperature of 20-30° C. for 2-3 minutes. After etching the heat sink 100, it can be washed with water.

An oxidation layer 110 is formed on the surface of the heat sink 100 by etching the surface of the heat sink 100 (FIG. 1b). Particularly, such a formation of the oxidation layer 110 may be required to prevent from the auto-oxidation of the metal heat sink with exposure to air.

According to the present invention, it is possible to form the oxidation layer without anodizing of the related art which is performed by passing an electric field on a metal heat sink, releasing metal ions from the metal heat sink, and bonding with oxygen.

The step of modifying the surface of the heat sink 100 using the composition of the present invention (FIG. 1c) may further include preparing a composition for modifying the surface of the heat sink, wherein the composition includes an organic titanium compound, an organic silane compound, an organic acid, an ion sequestering agent and a buffer dissolved in the distilled water. The composition may further include an organic solvent.

The heat sink 100 may be deposited into the composition for modifying the surface of the present invention and dried by hot wind.

When the step of modifying the surface (FIG. 1c) is completed, a rough surface layer 120 consisting of titanium oxides may be formed on the oxidation layer 110 formed on the metal heat sink 100.

Figure 1D:
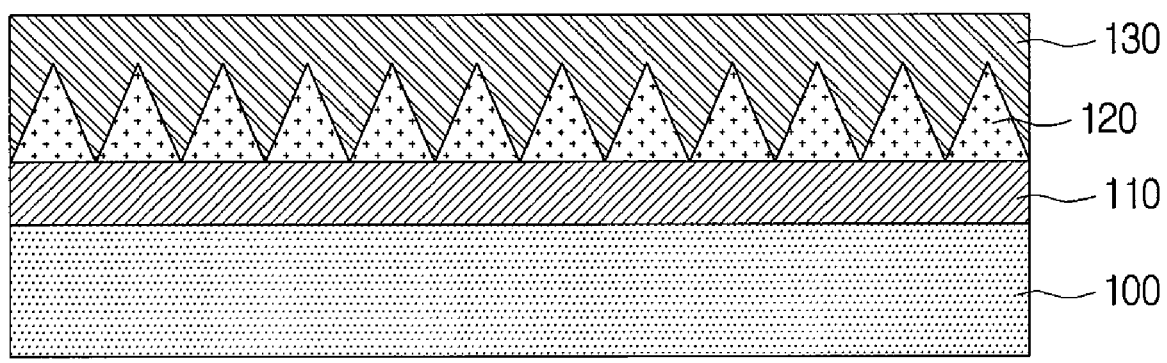

The rough surface layer 120 allows the adhesion of the heat sink surface to prepreg 130 as shown in FIG. 1d, in which the adhesion may be more strengthened by the roughness on the surface of the rough surface layer. Therefore, the problem of inefficient heat transfer associated with the related art can be solved.

The present invention will be more understood by the examples below, but the examples set forth below is just for illustration, and thus the scope of protection of the invention is not to be limited to the examples stated below.

EXAMPLE 1

Aluminum 1235 (hereinafter, "Al 1235") was degreased with an aluminum acid-degreaser (EAC-703, available from Y. M. Technology, Co., Ltd., Korea) containing 5% sodium hydroxide at 50° C. for 3 minutes and washed. The acid-degreased Al 1235 was etched using an etchant (EAS-704, available from Y. M. Technology, Co., Ltd., Korea) containing 5% sulfuric acid, at 25° C. for 1 minute and washed.

1.0 part by weight of isopropyl alcohol, 1.5 parts by weight of triethanolamine titanate, 0.3 parts by weight of aminopropyltrimethoxysilane, 1.0 part by weight of acetic acid, 0.5 parts by weight of triethanolamine and 1.0 part by weight of amino acetic acid were dissolved into distilled water to prepare a composition for surface modification. The Al 1235 after washing was deposited into the composition for surface modification and then surface-modified with controlling pH to 9-10 using sodium hydroxide and an organic acid at 25° C. for 1 minute. After surface-modifying, it was dried by hot wind of 100-150° C. for 3-5 minutes.

Example 1 was conducted under the general condition, the concentration of each composition can vary within the predetermined range according to operation conditions, and preferable embodiment of the present invention is not limited to Example 1.

When the surface-modified heat sink as set forth above is installed in the printed circuit board, it allows heat generated in chips of the printed circuit board to be dispersed inside and outside of the board to maximize heat-releasing performance. In particular, the metal heat sink is able to exhibit the ground effect by allowing electrical connection.

In addition, it has been difficult to release or lower heat within the printed circuit board since the adhesion between a heat sink and an insulating layer (that is, prepreg 130) is not good enough, however, the heat sink 100 produced in Example 1, which is one embodiment of the present invention, overcomes this problem by having the rough surface layer 120 which allows excellent adhesion strength with the prepreg and consequently maximizes the heat releasing efficiency.

The heat sink 100 produced in Example 1 was tested for adhesion, chemical resistance and boil-proof characteristics, the results are summarized in Table 1.

TABLE 1

| Test | | Result | Method |
| --- | --- | --- | --- |
| Adhesion | Cross cut | 100/100 | Using 3M cellophane tape |
| | Coin | excellent | Using 10 W coin |
| Chemical Resistance | Sulfuric acid | excellent | Depositing into 20% sulfuric acid for 18 hours |
| | sodium hydroxide | excellent | Depositing into 25% sodium hydroxide for 1 hour |
| Boil-proof Characteristics | Blister adhesion | excellent excellent | Depositing into 100° C. distilled water for 2 hours |

What is claimed is:

1. A composition for surface modification of a heat sink, the composition comprising:
   0.01 to 10 parts by weight of an organic titanium compound;
   0.01 to 5 parts by weight of an organic silane compound;
   0.1 to 10 parts by weight of an organic acid;
   0.01 to 5 parts by weight of a sequestering agent; and
   0.1 to 10 parts by weight of a buffer;
   with respect to 100 parts by weight of distilled water.

2. The composition of claim 1, wherein the organic titanium compound is at least one selected from the group consisting of diethanolamine titanate, acetylacetonate titanate, ethylacetoacetate titanate, triethanolamine titanate, lactic acid titanate and ammonium salt.

3. The composition of claim 1, wherein the organic silane compound is at least one selected from the group consisting of ethyltrimethoxysilane, glycidoxypropyltrimethoxysilane, glycidoxypropylmethyldiethoxysilane, glycidoxypropyltriethoxysilane, aminopropyltrimethoxysilane, aminopropyltriethoxy silane and their derivatives.

4. The composition of claim 1, wherein the organic acid is at least one selected from the group consisting of acetic acid, formic acid, succinic acid, malic acid, propionic acid and adipic acid.

5. The composition of claim 1, wherein the sequestering agent is at least one selected from the group consisting of nitrilioacetic acid, ethylenediamine tetraacetic acid and triethanolamine.

6. The composition of claim 1, wherein the buffer is at least one selected from the group consisting of monobasic acid, dibasic acid and their salts.

7. The composition of claim 6, wherein the buffer is at least one selected from the group consisting of acetic acid, propionic acid, adipic acid, succinic acid, amino acetic acid, formic acid and their salts.

8. A method for surface treatment of the heat sink of printed circuit boards, the method comprising:
preparing a heat sink;
etching at least one surface of the heat sink; and
surface-modifying the heat sink using the composition as defined in claim 1.

* * * * *